United States Patent
Villemazet et al.

(10) Patent No.: US 6,788,139 B2
(45) Date of Patent: Sep. 7, 2004

(54) BROADBAND PREDISTORTION LINEARIZER

(75) Inventors: Jean-François Villemazet, Cintegabelle (FR); Pascal Moroni, Toulouse (FR); Bernard Cogo, Montrabe (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/309,172

(22) Filed: Dec. 4, 2002

(65) Prior Publication Data
US 2003/0117216 A1 Jun. 26, 2003

(30) Foreign Application Priority Data
Dec. 6, 2001 (FR) .............................. 01 15774

(51) Int. Cl.$^7$ .............................................. H03F 1/26
(52) U.S. Cl. ...................................... 330/149; 330/286
(58) Field of Search ........................ 330/53, 107, 124 R, 330/149, 286

(56) References Cited

U.S. PATENT DOCUMENTS

| | | | | |
|---|---|---|---|---|
| 5,015,965 A | * | 5/1991 | Katz et al. | 330/149 |
| 5,291,148 A | * | 3/1994 | Reisner et al. | 330/149 |
| 5,304,944 A | * | 4/1994 | Copeland et al. | 330/149 |
| 5,703,531 A | * | 12/1997 | Vaughn et al. | 330/149 |
| 5,966,049 A | * | 10/1999 | Yuen et al. | 330/124 R |
| 5,999,064 A | | 12/1999 | Blaka et al. | |
| 6,211,734 B1 | * | 4/2001 | Ahn | 330/124 R |
| 6,255,908 B1 | | 7/2001 | Ghannouchi et al. | |

FOREIGN PATENT DOCUMENTS

| | | |
|---|---|---|
| EP | 0 277 636 A2 | 8/1988 |
| EP | 0 844 732 A1 | 5/1998 |
| EP | 0 984 509 A2 | 3/2000 |
| EP | 1 098 435 A1 | 5/2001 |

* cited by examiner

*Primary Examiner*—Khanh Van Nguyen
(74) *Attorney, Agent, or Firm*—Sughrue Mion, PLLC (57) ABSTRACT

The invention relates to a predistorsion linearizer for a power amplifier operating in the microwave range, the linearizer comprising means for conferring gain and phase predistorsion which compensate the gain and phase non-linearities of the corresponding amplifier, in particular an amplifier of the electronic tube type. The linearizer is characterized in that it comprises: a "linear" first path comprising a Lange coupler having each of its two accesses grounded via a respective passive element, and a "non-linear" second path comprising a Lange coupler having each of its two accesses grounded via a respective active element, the addition of a transmission line of variable length in at least one of the two paths enabling the (non-constant) frequency response of the linearizer to be adjusted in order to compensate the response of the amplifier that is to be linearized.

5 Claims, 7 Drawing Sheets

FIG_1

FIG_1a

FIG_1b

FIG_1c

FIG_2 (PRIOR ART)

FIG_3

FIG_6

FIG_7

FIG_8

FIG_9

FIG_10

BROADBAND PREDISTORTION LINEARIZER

The invention relates to a predistorsion linearizer for an amplifier having a broad frequency band, in particular in the microwave range.

BACKGROUND OF THE INVENTION

When the power requirements of electronic signals are large, use is made of an amplifier which is caused to operate close to its saturation power. By way of example, mention can be made of the transmission requirements of telecommunications satellites for which traveling wave tube amplifiers are used.

Operating the amplifier close to saturation gives it a response that is not linear. More precisely, when the input power is well below saturation power, then output power is substantially proportional to input power. However, as input power comes closer to saturation power, gain decreases, and takes on the value 1 at saturation. This non-linearity also affects the phase of the output signal: phase remains constant when the amplifier is operating away from its saturation zone, but for certain amplifiers (and in particular traveling wave tube amplifiers) phase decreases as power approaches the saturation value.

To remedy that drawback, it is common practice to use predistorsion linearizer devices, particularly with tube amplifiers for which both gain and phase decrease as input power approaches the saturation value. Such a device is placed upstream from the amplifier or tube to be linearized. It provides an output signal whose amplitude and phase vary as a function of input power in non-linear manner so that both the amplitude and the phase of the signal output by the amplifier vary in linear manner as a function of the signal input to the predistorsion device.

More precisely, in the linearizer device, predistorsion is applied both to gain and to phase so as to keep gain and phase constant for input power values well below saturation power and also provide gain and phase which increase with increasing input power approaching saturation power, thus compensating the decrease in gain and phase due to the amplifier.

Figures 1, 1A:
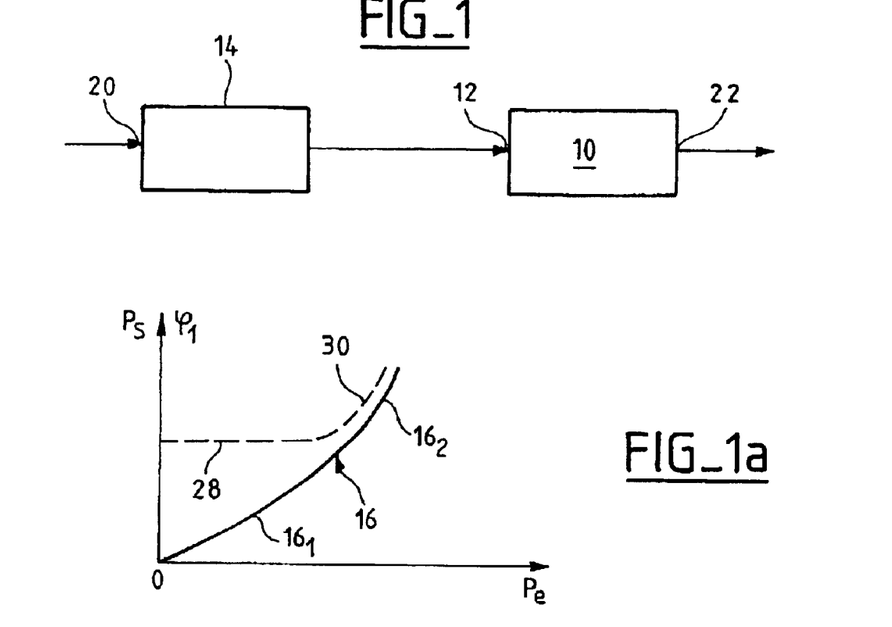

This principle is shown in FIG. 1 where there can be seen, for example, a tube power amplifier 10 for use on board a spacecraft, such as a satellite, in order to power one or two transmit antennas (not shown) in a telecommunications system. The signal to be amplified is applied to the input 12 of the amplifier 10 via a linearizer device 14 of the predistorsion type.

The graph of FIG. 1a plots output power $P_s$ up the ordinate axis as a function of input power $P_e$ along the abscissa axis. In this graph, curve 16 corresponds to the linearizer device 14. It can be seen that at low input powers the curve 16 presents a linear portion $16_1$ and that for higher levels of input power it presents a non-linear portion $16_2$ of slope that is steeper than that of the linear portion $16_1$.

Figure 1B:
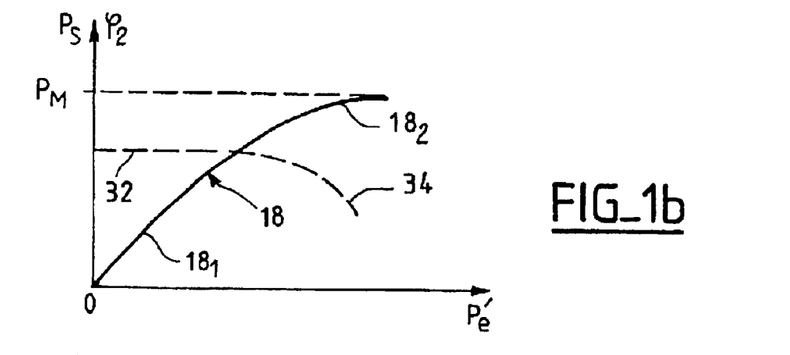

The graph of FIG. 1b shows the way in which the amplifier 10 operates, in this case a traveling wave tube. This graph is analogous to that of FIG. 1a. Curve 18 has a first portion $18_1$ that is linear and a second portion $18_2$ that is non-linear for higher values of output power $P_S$ when this power comes close to the saturation power $P_M$. In its portion $18_2$, the slope is smaller than the slope of the linear portion $18_1$ and it comes close to zero.

Figure 1C:
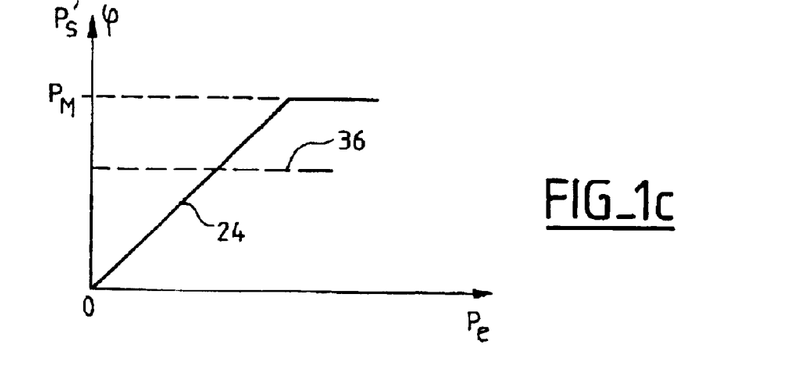

In the graph of FIG. 1c, there can be seen the relationship between the signal $P_e$ at the input 20 of the device 14 and the signal $P'_s$ at the output 22 of the amplifier 10. It can be seen that the curve showing variation in $P'_s$ as a function of $P_e$ presents variation 24 that is linear all the way to saturation $P_M$.

The graphs of FIGS. 1a to 1c also show, in dashed lines, the variations in the phase φ of the output signals as a function of the powers $P_e$ or $P'_e$ of the input signals. In FIG. 1a it can be seen that the phase $\phi_1$ of the signal on the output of the device 14 remains constant (flat portion 28) for lower values of input power $P_e$ and increases in non-linear manner (portion 30) for input powers that approach saturation power.

In FIG. 1b, it can be seen that the phase $\phi_2$ of the signal on the output 22 of the amplifier 10 is constant for smaller values of the power $P'_e$ on the input 12 and decreases in non-linear manner (portion 34) when this input power comes close to saturation power.

In FIG. 1c, it can be seen that the phase of the signal on the output 22 remains constant (straight line 36).

Various types of predistorsion linearizers have already been studied. A first family of predistorsion linearizers is described, for example, in document U.S. Pat. No. 4,992,754 in the name of Blauvelt et al., assigned to Ortel Corp. (USA). According to the teaching of that document, the payload signal is applied to a delay line while the correction signal is generated in a parallel branch, with amplitude adjustment of the signal so as to make it equal to the non-linearity of the amplified signal, and phase adjustment of the signal so as to obtain phase opposition relative to the payload signal propagating along the delay line. The payload signal and the correction signal are added by means of a microwave combiner or coupler, and subsequently applied to the inlet of the power microwave amplifier. The non-linearities observed at the outlet from the power amplifier stage are thus substantially diminished if not eliminated.

Mention can also be made of another known type of predistorsion linearizer, e.g. as disclosed in document U.S. Pat. No. 4,068,186 to Sato et al., in the name of KDD (Japan). That linearizer is designed to work at very high frequencies to mitigate the non-linearities of a traveling wave tube (TWT) type amplifier or of a klystron. As the non-linearity generator, Sato et al. teach the use of a low power TWT. That type of amplifier introduces a small amount of delay (due to the finite propagation speed of electrons in a vacuum) in the amplified signal relative to the non-amplified signal. In order to synchronize the signals from the non-linear path and the linear path, it is therefore necessary to introduce a delay line in the correcting branch. The device of Sato et al. is relatively complicated because there are two corrector members upstream and downstream from a power splitter and a power combiner that are connected together by the two paths referred to as the linear path and the non-linear path. The linear path also comprises a microwave amplifier whose operating point is selected to be close to saturation in order to generate non-linearities which depend on the power of the input signal. In order to be able to adjust the output level from the predistorsion linearizer device without acting on the gain of the amplifier, a variable attenuator is situated at the outlet of the amplifier. The non-linear path has another member for correcting the phase/frequency characteristics. The signals from the two paths are applied to the two inputs of a second combiner coupler where they are added together (also with a phase shift θ between the two signals). This combiner coupler can be a 3 dB hybrid coupler, for example, thus giving rise to a further phase shift of θ=π/2.

That prior art device therefore comprises two members for correcting the non-linear amplitude/frequency characteristic together with a member for correcting the phase/frequency characteristic. Embodiments of such corrector members are described in the Sato et al. document, and the text of that description is expressly incorporated by reference in the present application for its description of prior art embodiments.

The non-linear characteristics of those members add to the non-linear characteristics of the microwave amplifier. The transfer functions of all those members vary in disparate manner as a function of the frequency and the amplitude of the signals, or indeed as a function of the temperature of the components. Precautions are taken so that the non-linear signal as generated in that way is added to the payload signal in phase opposition so as to cancel the non-linearities of the power microwave amplifier (not shown), but only in a relatively narrow frequency band and in a relatively small range of inlet powers, and at a given temperature.

By acting on the characteristics of the corrector members, it is possible to obtain a transfer function having gain and phase that increase with input signal level. This is generally the desired response when it is desired to linearize a power TWT.

Another adjustment of the corrector members makes it possible to obtain a transfer function whose gain increases with the level of the input signal but whose phase decreases therewith. This is the looked-for response when it is desired to linearize a solid state power amplifier.

Another broadband microwave linearizer is described in the article by A. M. Khilla, entitled "Novel broadband linearizers and their application in power amplifiers for satellite transponders and ground stations", appearing in Proceedings Second European Conference on Satellite Communications", Liege, Belgium, Oct. 22–24, 1991, pp. 229–234, published by the European Space Agency (ESA), publication No. SP-332, which article constitutes an integral portion of the present application for its description of the prior art.

That document teaches the use of a predistorsion circuit in order to linearize a broadband amplifier of a space transponder in Ku band. As in the Sato et al. document, that circuit has two branches connected together at their ends by two 3 dB hybrid couplers, each introducing a phase shift of 90°. It also teaches the use of equivalent electrical lengths in the two branches, a configuration which is rather rare in the other predistorsion circuits described elsewhere in the literature.

The principle of predistorsion linearizers illustrated by the above-mentioned prior art documents is suitable for microwave applications. Nevertheless, it suffers from various major drawbacks which make implementation difficult. Amongst others, the following may be mentioned:

a first drawback lies in the fact that the operations of initially adjusting the circuits for correcting the amplitude/frequency characteristic and the corrector of the phase/frequency characteristic are often lengthy and difficult to perform, with the task being made more complicated in the usual case where the electrical lengths of the two paths are generally very different; and a second drawback of prior art devices is that the width of the optimum operating band of the device for correcting non-linearities is limited by differences or differential variations in the electrical lengths of the two paths, either as a function of the frequency or as a function of the amplitude of the signals to be amplified, or else as a function of operating conditions, and in particular temperature.

In French patent FR 2 719 954 and its equivalent U.S. Pat. No. 5,576,660 in the name of Pouysegur, those problems are addressed with a linearizer of the kind shown in FIG. 2. That linearizer has two paths with electrical lengths that are substantially identical as in the above-mentioned Khilla linearizer. Another feature of that linearizer is that both paths are made up of identical components so as to avoid one path drifting relative to the other in the event of a change in temperature. In contrast, that linearizer is effective only over a relatively narrow frequency band.

In another patent having the same inventors as the present application: FR 2 791 197 and its equivalent EP 1 039 630 A1, a broadband linearizer is taught which operates over a bandwidth of 1.5 GHz in Ku band, but unfortunately that invention appears to us to be difficult to transpose in hybrid technology to Ka band. One of the objects of the present invention is thus to propose a broadband linearizer capable of being used in all of the various frequency bands commonly used on board telecommunications satellites, namely bands: C, Ku, and soon Ka.

Apart from the last-mentioned embodiment, the previous predistorsion devices that are capable of being used in space applications operate correctly only for bandwidths that are relatively narrow, for example 250 MHz to 500 MHz in frequency ranges lying from 10.7 GHz to 12.75 GHz.

As mentioned above, various linearizer devices are also known for amplifier tubes that are capable of operating over a broad band of frequencies, in particular over a bandwidth of 1.5 GHz to 2 GHz in Ku band. Nevertheless, those known devices present complex structures relying on a plurality of microwave integrated circuits. They are difficult to adjust and they are sensitive to temperature. In addition, they are generally expensive and bulky, which is a severe drawback for numerous applications, and in particular applications in space. Their use at high frequencies such as the Ka band around 20 GHz would appear to be difficult.

OBJECTS AND SUMMARY OF THE INVENTION

An object of the invention is to mitigate the drawbacks of the prior art.

The device of the invention makes it possible to perform linearization over a broad band of frequencies. It can be implemented at low cost and using a microwave integrated circuit technique. It can be used in all of the frequency bands presently in use for space telecommunications. Circuit adjustment is easy and reproducible, which gives rise to savings in implementation.

The linearizer device of the invention which operates in the microwave range is a broadband predistorsion linearizer for the gain and the phase of a power amplifier operating in the microwave range and comprising means for conferring gain and phase predistorsion to compensate the gain and phase non-linearities of the corresponding amplifier, said linearizer further comprising:

an inlet splitter having one inlet and two outlets;
a "linear" first path and a "non-linear" second path, said linear and non-linear paths presenting, by construction, the same group propagation times; and
an outlet combiner having two inlets and one outlet;
the linearizer being characterized in that:
said non-linear path having a broadband non-linear element comprises a Lange coupler, each of its two accesses being grounded via respective active elements; and said linear path comprises a Lange coupler identical to that of the non-linear path, each of its two accesses being grounded via a respective passive element.

In a preferred embodiment, said two active elements are diodes, the feed voltages therefor, via respective serial resistors, serving to adjust the curve of non-linearity gain extension as a function of the incident power. In an embodiment, said two passive elements are open-circuit segments of microwave transmission line ("stubs") of adjustable length, the length serving to adjust relative phase between the linear and non-linear paths in constant manner over the entire frequency band, thus performing the function of a phase shifter.

In a preferred embodiment, at least one of said linear path and said non-linear path includes a transmission line of adjustable length so as to make it possible starting from equal group propagation time between the paths to modify said parameter and thus adjust the recombination phase as a function of frequency, and consequently adjust the frequency response of the linearizer in this manner in order to compensate the frequency response of the amplifier to be linearized.

In another preferred embodiment, at least one of said linear path and said non-linear path (preferably the linear path) includes at least one etched resistor in series or parallel with the transmission line and acting as an attenuator of value that is adjustable between a finite value and zero by short-circuiting the resistor with a foil or at least a metal wire.

In another preferred embodiment, said splitter is a 0° Wilkinson coupler.

In another preferred embodiment, said combiner is a 0° Wilkinson coupler.

BRIEF DESCRIPTION OF THE DRAWINGS

Other characteristics and advantages of the invention appear from the description of various embodiments, the embodiments being described with reference to the accompanying drawings, in which:

FIG. 1, described above, is a block diagram of a power amplifier and of a predistorsion linearizer device, together with the corresponding characteristics of output power as a function of input power for said two elements constituting FIGS. 1a and 1b, and the resultant characteristic constituting FIG. 1c;

MORE DETAILED DESCRIPTION

The figures are given as non-limiting examples for illustrating the main characteristics of the invention and its variants. The same references are used to refer to the same elements in the various figures. The figures are not always to scale for reasons of clarity. Equivalent means may be substituted for the elements shown in the figures without thereby going beyond the ambit of the invention.

Figure 2:
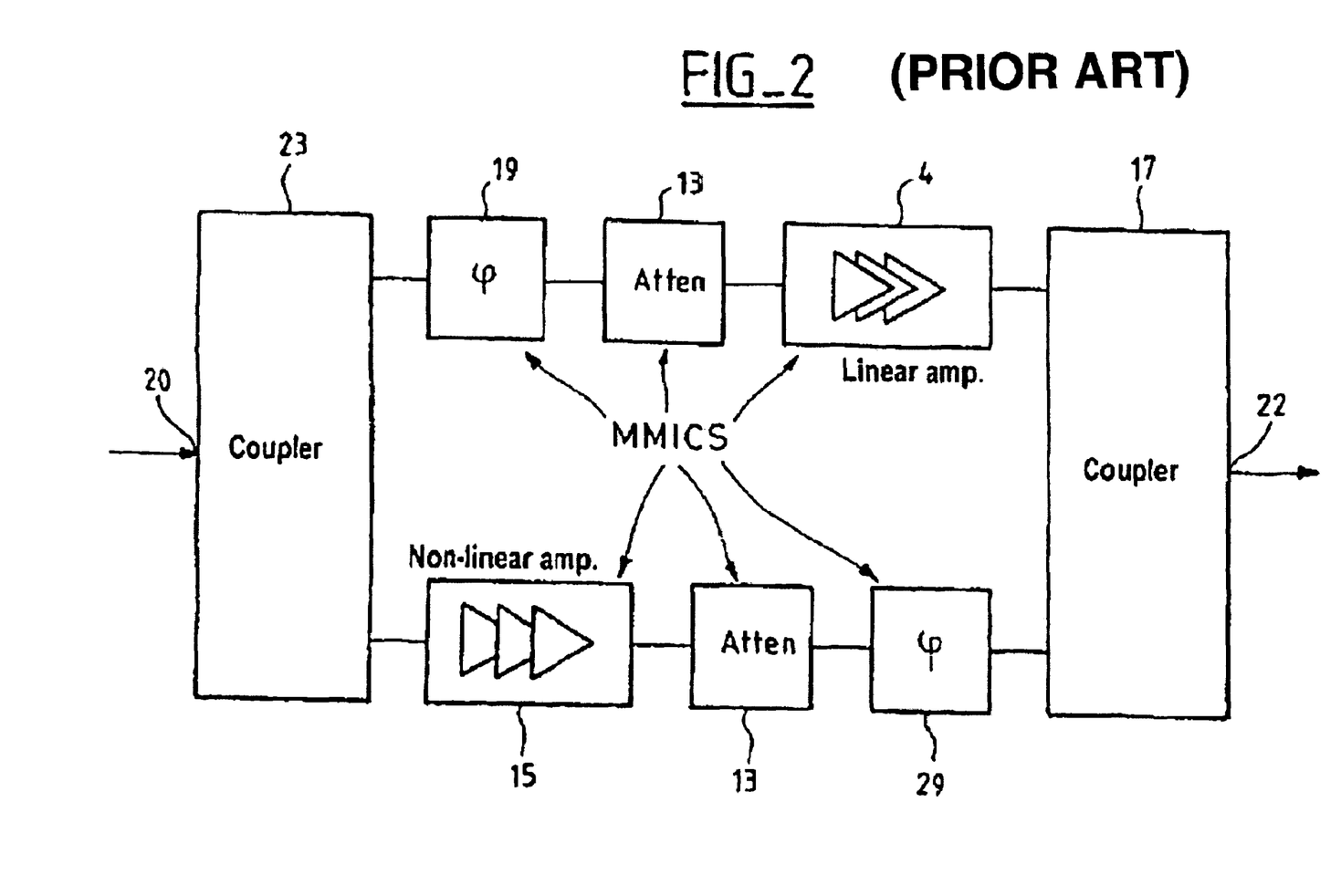
FIG. 2 is a block diagram of a predistorsion linearizer device known from the prior art, and in particular from French patent No. 2 719 954 and the equivalent U.S. Pat. No. 5,576,660 in the name of Pouysegur.

FIG. 2 shows an example of a prior art linearizer. As in the preceding figure, the signal to be amplified is applied to the input 20 of the linearizer, from where it is applied to the input of a power splitting coupler 23. The signal is thus split into two portions, which portions are applied respectively to the inputs of two transmission lines. Conventionally, the coupler/splitter 23 introduces a phase shift e between the two signals it outputs to the two transmission lines. By way of example, the coupler 23 can be a 3 dB hybrid coupler, thus giving rise to a phase shift $\theta=\pi/2$ $(=90°)$.

The first transmission line (referred to as the "non-linear" path) comprises an amplifier 15, a distorsion generator that is non-linear in amplitude in the same manner as the power amplifier that is to be linearized, a variable attenuator 13, and a variable phase shifter 29.

On the second transmission line (referred to as the "linear" path), there are likewise to be found a variable phase shifter 19, a variable attenuator 13, and a microwave amplifier 4.

The signals on the two paths are then added together by a combiner coupler 17. the predistorted correction signal is supplied at the output 22 of the combiner coupler 17. The predistorted correction signal is delivered at the output 22 of the combiner coupler 17 to a power microwave amplifier (not shown). Conventionally, the combiner coupler 17 imparts a phase shift θ between the two signals output to the two transmission lines. This coupler 17 may be a 3 dB hybrid coupler, for example, imparting a phase shift of $\theta=\pi/2$ $(=90°)$.

Figure 3:
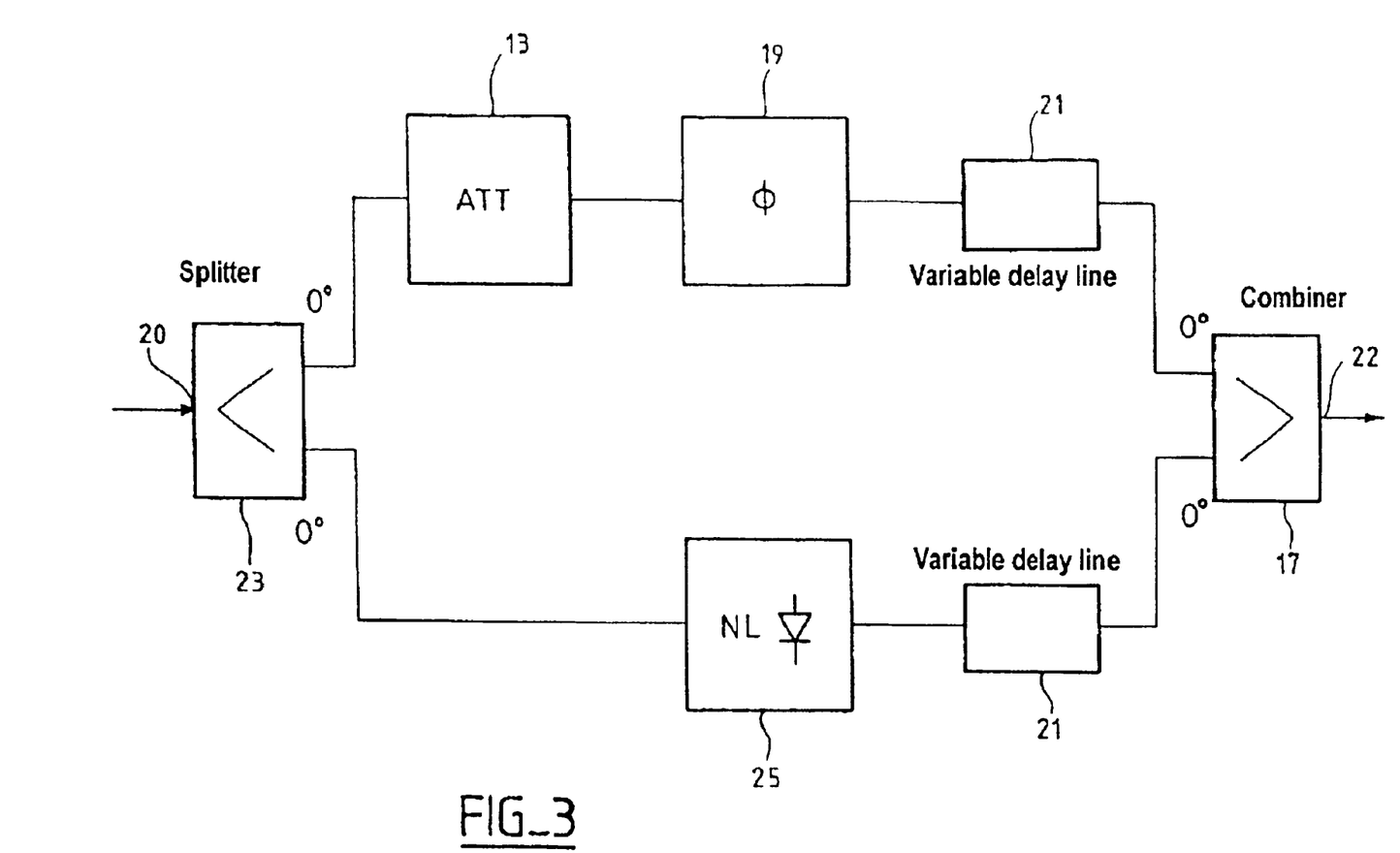
FIG. 3 is a block diagram of a broadband predistorsion linearizer device in accordance with the invention.

FIG. 3 is a block diagram of a broadband predistorsion linearizer device in accordance with the invention. The architecture of FIG. 3 relies on conventional principles such as:

vector recombination of a linear path and a non-linear path;

the use of attenuators 13, of phase shifters 19, of a non-linearity 25, and optionally delay lines 21; and the fact of having the same group propagation times (GPTs) between the two paths over a given frequency band.

Figure 4:
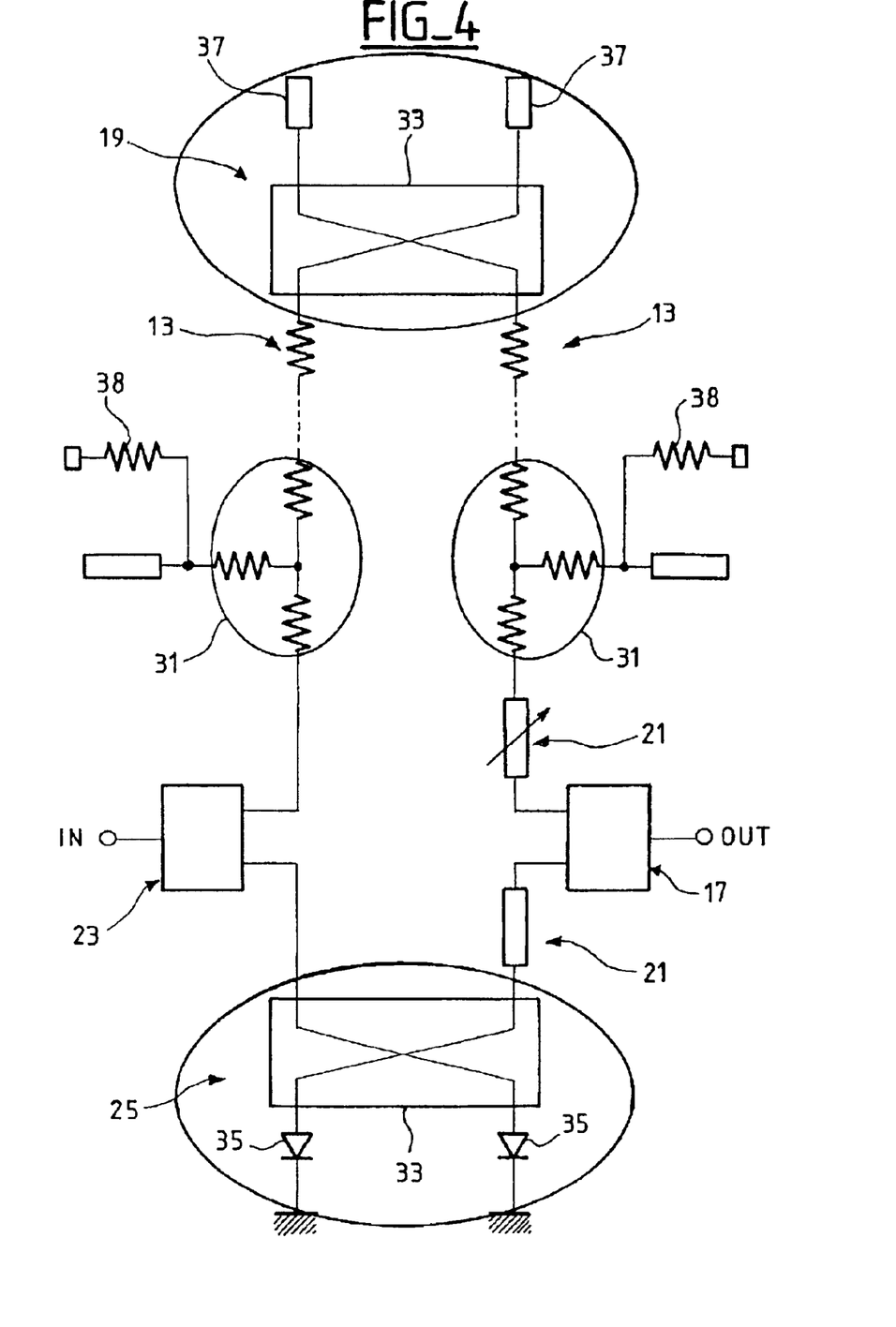
FIG. 4 is an electrical circuit diagram of an embodiment of a broadband predistorsion linearizer device in accordance with the invention.

The differences with the prior art are easily understood on referring to FIG. 4 which is an electrical circuit diagram of an embodiment of a broadband predistorsion linearizer device in accordance with the invention.

As in the preceding diagram, there are two paths, a linear path and a non-linear path, between two couplers, a power splitter 23, and a power combiner 17. The non-linear path is at the bottom as in the preceding figure. In a preferred embodiment, there is a delay line 21 of variable length in one or other of the two paths, and in this case there is one in each of the two paths. Their purpose is explained below. Various attenuators 13, 31 are preferably mounted in the linear path, but may also be placed in the non-linear path; these make certain adjustments easier to perform in the factory.

Amongst the originalities that are characteristic of the invention, there can be seen on the two paths:

the linear path comprises mainly a phase shifter 19 constituted by a Lange coupler 33 whose two accesses are grounded via respective passive elements 37, e.g. capacitors (in a preferred embodiment they can be constituted, for example, by open-circuit "stubs", i.e. segments of line having one end as an open circuit); and the non-linear path mainly comprises a device that provides gain expansion as a function of incident power, this device being constituted by a Lange coupler 33 (preferably identical to that of the linear path) whose two accesses are grounded via respective active elements 35. In a preferred embodiment, these active elements are diodes. The two diodes 35 are preferably identical.

Figure 6:
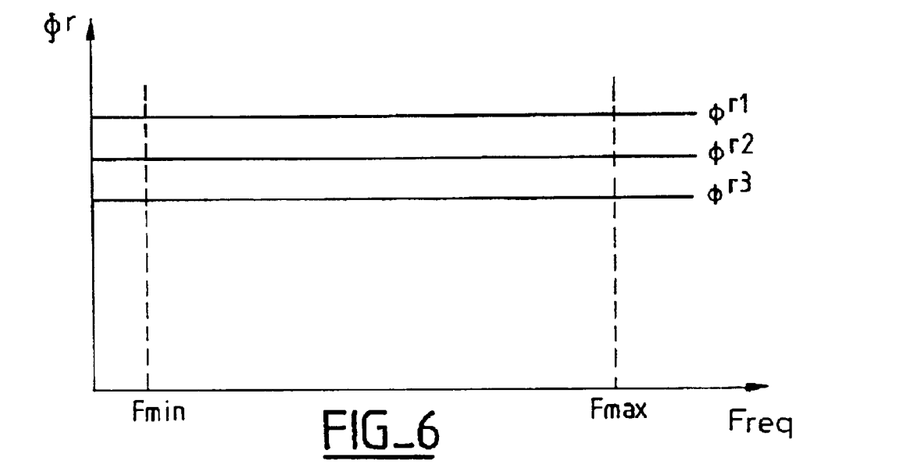
FIG. 6 shows the recombination phase between the linear path and the non-linear path as a function of frequency with a phase shifter in the first path and a non-linear element in the second path, for various electrical values of the passive element loading the linear path, in a broadband predistorsion linearizer device in accordance with the invention.

Placing these two devices face to face enables the linear and non-linear paths to have the same group propagation time over the entire operating frequency band of the phase shifter and of the non-linear element by construction. The recombination phase φr of each of the two paths is thus constant over the entire band under consideration, though the response of the linearizer made in this way is likewise constant over the same band. This result is shown in FIG. 6.

In a preferred embodiment of the invention, said "stubs" are of variable length, thus enabling the recombination phase φr1, φr2, φr3, ... to be controlled and making it possible to vary the response of the linearizer so as to be uniform over the entire frequency band (extending or compressing gain and/or phase). This result is also shown in FIG. 6.

In the preferred embodiment shown in FIG. 4, the diodes 35 of the non-linear element 33 are biased via high resistance resistors 38. The principle is to use the diodes 35 to implement an impedance that increases with incident power. The Lange coupler 33 is loaded at low level by a low impedance and has high levels of loss. With increasing impedance, the losses of the Lange coupler decrease, thereby generating the desired expansion in "gain". The corresponding diode is therefore initially biased (at low level) within the I(V) portion of its characteristic which corresponds to low impedance. The incident microwave power generates current that increases with increasing power. This current flowing through the resistor generates a voltage which automatically biases the diode away from its conduction characteristic, causing its equivalent impedance to go from a low value to a high value. Adjusting the voltage feeding the diode via the resistor serves to adjust the expansion of the gain of the non-linear element, constituting the "engine" of the linearizer.

Adding a transmission line 21 of variable length in one and/or the other of the paths has the purpose, starting from paths that are initially in balance by construction, of causing the recombination phase φr to vary and thus of varying the response of the linearizer as a function of frequency. Adjustment is very simple insofar as only the length of the line is involved:

$$\Delta\phi r(f) = \beta l = 2\pi f l / c$$

where:
f: frequency
c: $3 \times 10^8$ meters per second (m/s)
l: length of the line.

Figure 7:
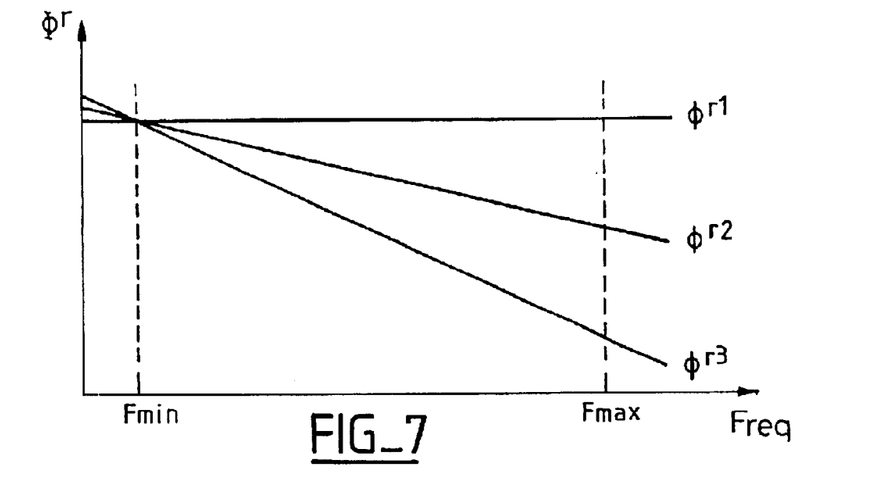
FIG. 7 shows the recombination phase between the linear path and the non-linear path as a function of frequency with the addition of a variable length of line in one or other of the paths, in a broadband predistorsion linearizer device in accordance with the invention.

The result is shown in FIG. 7. The recombination phase between the linear path and the non-linear path is a linear function of frequency in the working band of the linearizer, and its slope is determined by the length of the variable length line 21.

Figure 5:
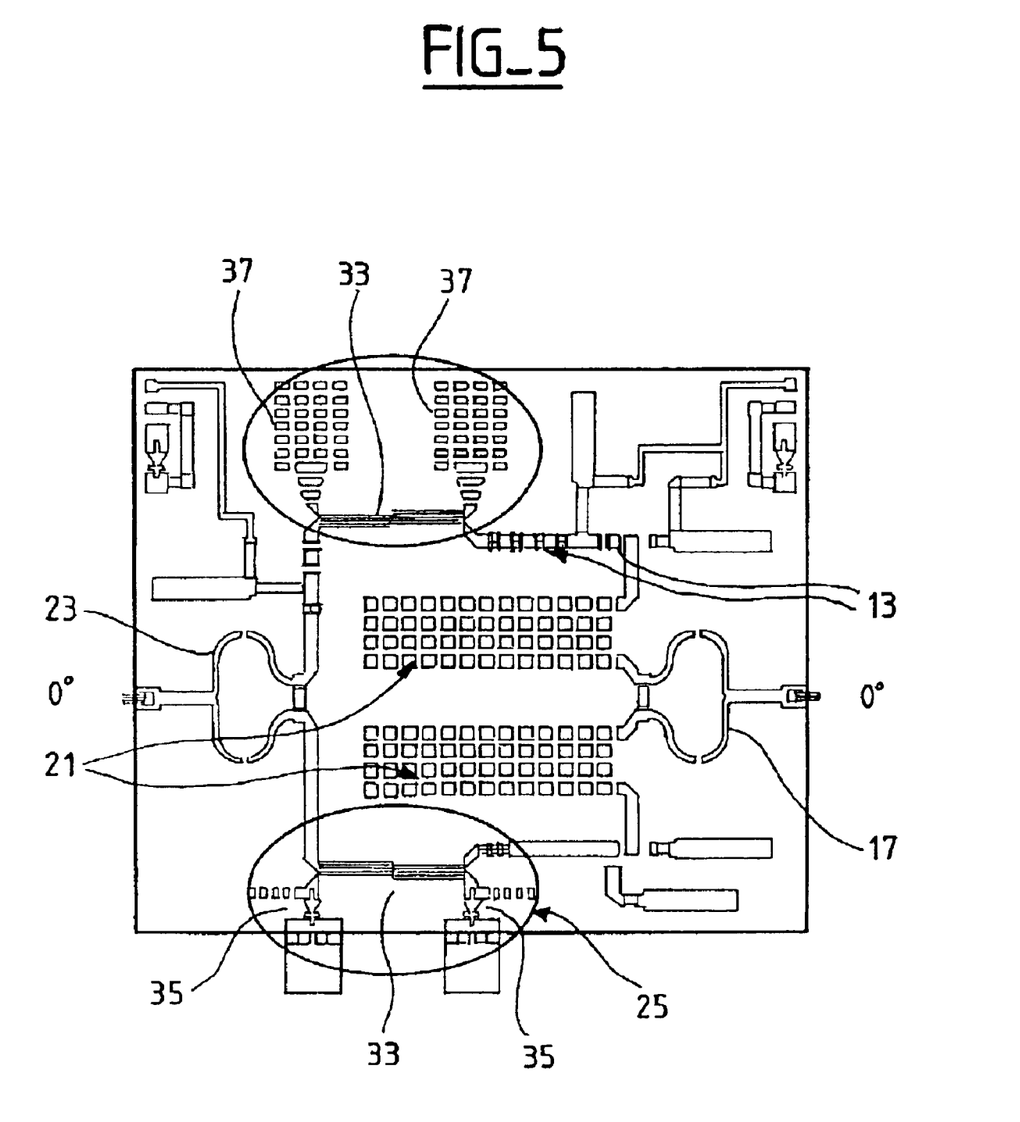
FIG. 5 is a diagram showing a possible physical layout for an embodiment of a broadband predistorsion linearizer device in accordance with the invention.
Figure 8:
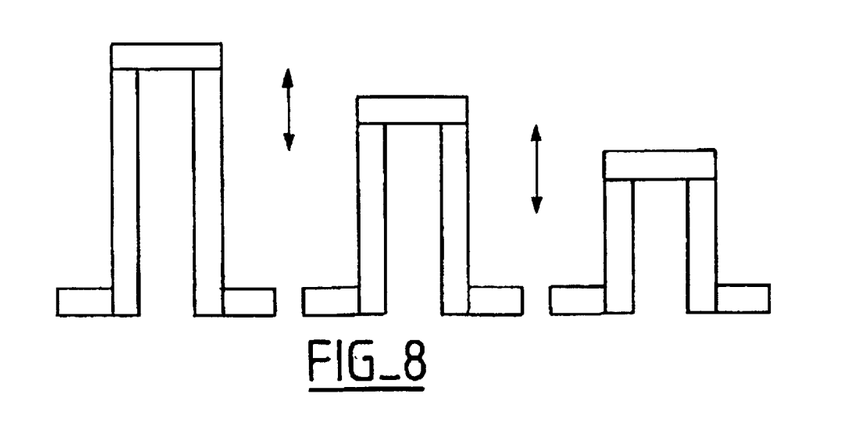
FIG. 8 shows the principle on which a line of variable length can be made using hybrid technology.

It is easy to make a variable length line, as shown by the implantation diagram of FIG. 5 and as explained with the help of FIG. 8. Metal areas are etched on the substrate in a rectangular array. The length of the line can then be determined by connecting areas together. More areas gives greater length. A similar principle can advantageously be used for making the variable phase shifters 37.

In similar manner, variable attenuators can be made by etching. In order to avoid degrading the balance between the GPTs of the two paths, the relative amplitudes of the signals are adjusted prior to recombination by means of etched attenuators. These are segments of line in series with the transmission line and using a resistive metal. The insertion phase of this small device is homogeneous with that of a simple line and therefore does not degrade the GPT. A plurality of these attenuators are inserted on the line and they may be short-circuited by metal foil in order to perform adjustment. These attenuators are preferably implanted on the linear path in order to minimize the losses of the linearizer, since the non-linear element needs to operate with a given input power.

Figure 9:
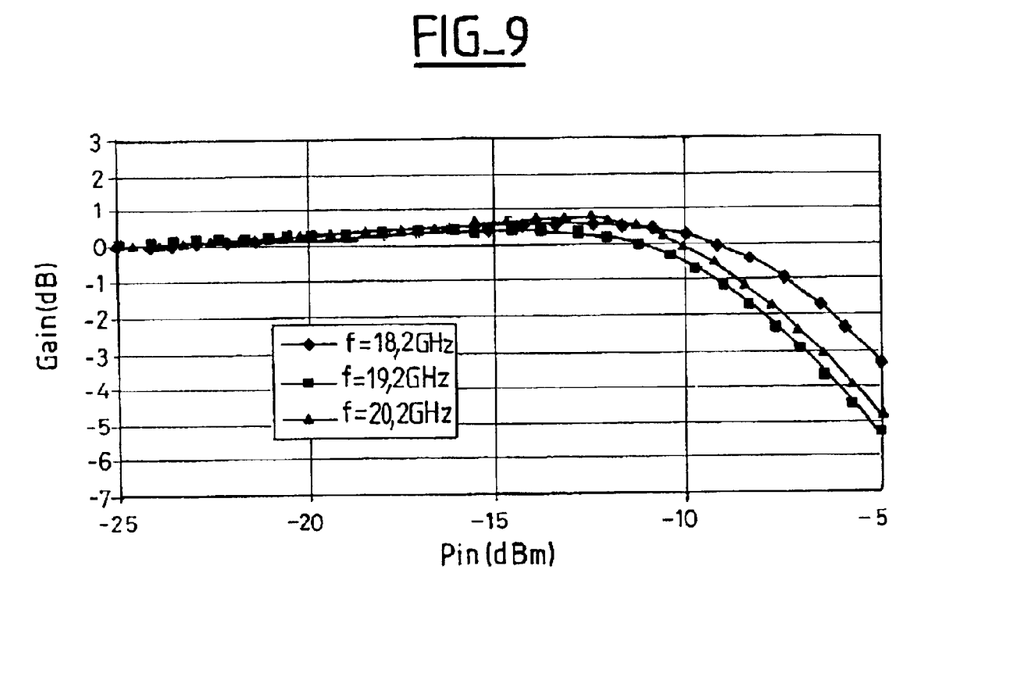
FIG. 9 shows the gain linearization measurements obtained with an experimental embodiment of a linearizer of the invention placed ahead of a highly non-linear traveling wave tube.

FIG. 9 shows measurements of gain linearization obtained with an experimental embodiment of a linearizer of the invention placed ahead of a traveling wave tube (TWT) having rather higher non-linearity at saturation. The TWT supplied 120 watts (W) in the Ka band from 18.2 GHz to 20.2 GHz. The TWT operating in saturation gives gain compression of 7 dB to 6.7 dB and −30° to −45° of phase shift in the same frequency band. The curves of FIG. 9 show excellent linearity of ±1 dB in the non-saturated region (below −10 dBm) with loss of only 5 dB to 6 dB in gain at saturation.

Figure 10:
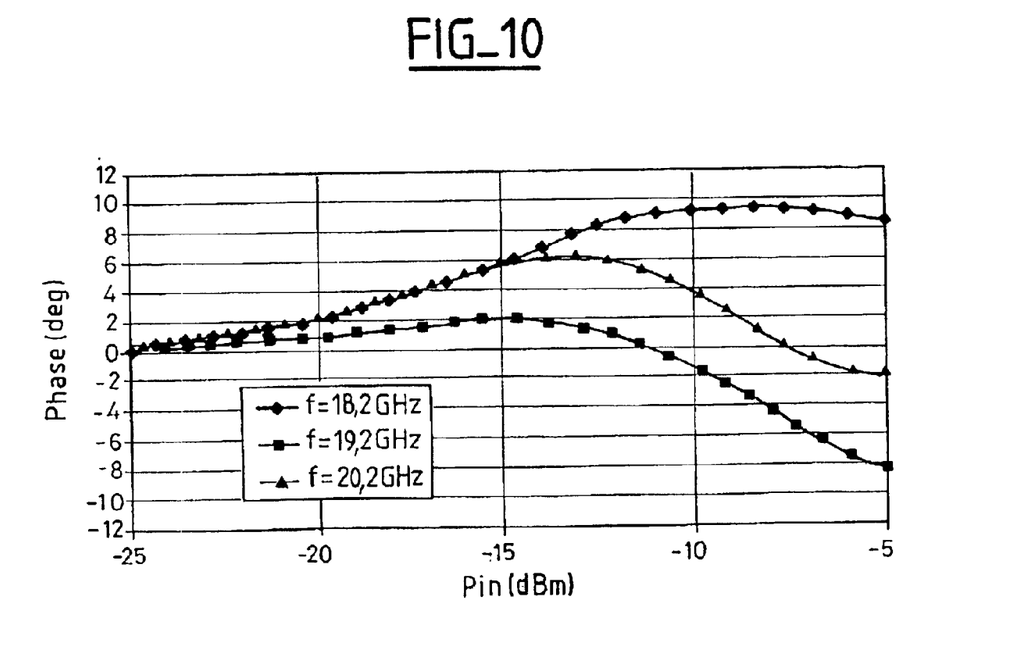
FIG. 10 shows the phase linearization measurements obtained with an experimental embodiment of the same linearizer as FIG. 9, ahead of the same traveling wave tube.

FIG. 10 shows measurements of phase linearization obtained with an experimental embodiment of the same linearizer as FIG. 9, ahead of the same traveling wave tube. It can be seen that phase shifting is less than ±10° over the entire frequency band, and for all input powers in the range −25 dBm to −5 dBm. These figures should be compared with the figures of the TWT used on its own which are as follows: −30° to −45° offset at −10 dBm, and as much as −40° to −70° at −5 dBm, the worst shifting occurring at the highest frequencies (20.2 GHz).

Naturally, the invention is not limited to the embodiments discussed and described above, but can apply to any embodiment using one or more means equivalent to the means described by way of example in order to achieve the same functions and in order to obtain the same results.

What is claimed is:

1. A broadband pre-distortion-linearizer of gain and phase for a power amplifier operating in the microwave range, the linearizer having means for conferring gain and phase pre-distortion-which compensate the gain and phase non-linearities of the corresponding amplifier, said linearizer further comprising:

an inlet splitter having one inlet and two outlets;
a linear first path and a non-linear second path, said linear and non-linear paths presenting, by construction, the same group propagation times;

an outlet combiner having two inlets and one outlet;

said non-linear path having a broadband non-linear element comprising a first Lange coupler with two accesses, wherein each of its respective two accesses are grounded via respective active elements; and said linear path comprising a second Lange coupler identical to the first Lanae coupler, wherein each of its respective two accesses beifig are grounded via a respective passive element;

wherein said two passive elements are open-circuit segments of microwave transmission line of adjustable length, the length serving to adjust a relative phase between the linear and non-linear paths in constant manner over the entire frequency band, and operable to perform the function of a phase shifter, and wherein further at least one of said linear path and said non-linear path includes at least one etched resistor in series with or parallel with the transmission line and acting as an attenuator having a value that is adjustable between a finite value and zero by short-circuiting the resistor with a foil or a metal wire.

2. A linearizer according to claim 1, wherein said two active elements are diodes and the feed voltages, via respective serial resistors, serve to adjust a curve of non-linearity gain extension as a function of incident power.

3. A linearizer according to claim 1, wherein at least one of said linear path and said non-linear path includes a transmission line of adjustable length so as to make it possible starting from equal group propagation time between the paths to modify said parameter and adjust the recombination phase as a function of frequency, and adjust the frequency response of the linearizer in this manner to compensate the frequency response of the amplifier to be linearized.

4. A linearizer according to claim 1, wherein said splitter is a 0° Wilkinson coupler.

5. A linearizer according to claim 1, wherein said outlet combiner is a 0° Wilkinson coupler.

* * * * *